(12) United States Patent
Stenestam

(10) Patent No.: US 6,962,435 B2
(45) Date of Patent: Nov. 8, 2005

(54) CONDITION DIAGNOSING

(75) Inventor: Bengt-Olof Stenestam, Ludvika (SE)

(73) Assignee: ABB Technology Ltd., Zürich (CH)

( * ) Notice: Subject to any disclaimer, the term of this patent is extended or adjusted under 35 U.S.C. 154(b) by 0 days.

(21) Appl. No.: 10/450,589

(22) PCT Filed: Dec. 14, 2001

(86) PCT No.: PCT/SE01/02783
§ 371 (c)(1),
(2), (4) Date: Jun. 16, 2003

(87) PCT Pub. No.: WO02/48718
PCT Pub. Date: Jun. 20, 2002

(65) Prior Publication Data
US 2004/0057491 A1 Mar. 25, 2004

(51) Int. Cl.$^7$ .......................... G01K 13/00; G01K 17/06
(52) U.S. Cl. .............................. 374/152; 374/39; 374/29
(58) Field of Search ................................ 374/152, 134, 374/29, 30, 31, 39

(56) References Cited

U.S. PATENT DOCUMENTS 4,745,571 A * 5/1988 Foster ........................ 700/299
4,775,245 A * 10/1988 Hagerman et al. .......... 374/134
5,701,044 A * 12/1997 Emshoff et al. .............. 310/54
6,609,079 B1 8/2003 Seitlinger
2004/0021449 A1 * 2/2004 Stenestam et al. .......... 323/255

FOREIGN PATENT DOCUMENTS

| EP | 1085635 A2 * | 3/2001 | ............ H02H/7/04 |
| JP | 9233835 A | 9/1997 | |
| JP | 11354233 A | 12/1999 | |
| JP | 2003185690 A * | 7/2003 | ........... G01R/31/00 |
| WO | WO 9960682 A1 | 11/1999 | |

* cited by examiner

Primary Examiner—Gail Verbitsky
Assistant Examiner—Mirellys Jagan
(74) Attorney, Agent, or Firm—Venable LLP; Eric J. Franklin

(57) ABSTRACT

The present invention discloses a method and apparatus (5) for condition diagnosing of an inductive power device (1), such as a transformer or reactor, having power windings (2) immersed in a fluid (3) being cooled by cooling devices (4). The diagnosing method basically compares and evaluates expected heat flows into and out from the inductive power device (1) system together with an actual and a previous heat content of such a system. From the heat flows the heat balance in the system may be obtained and is used for diagnosing the operation conditions of the inductive power device (1). The results from the condition diagnosing may be used as indicators (70) that can alarm operators, may be sent as a data signal (80) to remote and/or portable display means (85), such as a computer, or may be used as input data to control or simulation systems.

52 Claims, 7 Drawing Sheets

CONDITION DIAGNOSING

TECHNICAL FIELD

The present invention generally relates to inductive power devices, such as power transformers and reactors, and in particular to a method and apparatus for condition diagnosing of inductive power devices.

BACKGROUND

An inductive power device, such as a power transformer, used by public utilities, typically has its power windings immersed in a fluid coolant, usually oil, within a transformer tank. During operation the windings and a core, around which the windings are wound, become heated and thereby heat the surrounding fluid. In general, the fluid is in turn cooled by a number of cooling devices provided outside of, but in connection to, the transformer. The cooling devices are typically provided with different fans to cool a flow of oil from the transformer. Upon heating, the fluid rises upwards to the top of the tank containing the fluid. Heated fractions of the fluid, extracted from the top of the tank is then cooled by the cooling devices and returned at the bottom of the transformer tank. Consequently, a cooling of the fluid and thereby indirectly of the power windings and core is accomplished.

A monitoring of the condition of an inductive power device is of benefit for a reliable and efficient operation. In particular, for a transformer the temperatures of the windings and of the cooling fluid need to be tightly followed. Serious accidents, possibly leading to the destruction of the entire or part of the transformer or a shortening of its life, may happen if the temperature of the windings and/or fluid increases over certain limits. Therefore, monitoring of the temperature of the fluid and/or windings is a common security measure when operating power transformers.

Several methods for obtaining the temperature of the windings and/or fluid exist in the prior art, being based on either simulations, calculations or more direct measurements. In its simplest form, a simulation of the winding temperature is performed by biasing a thermometer reading by an amount proportional to the winding current. A heater coil, or similar means, is normally arranged in connection to a thermometer in the fluid. The heater coil is in turn controlled by a current transformer, which provides the heater coil with a current proportional to the winding current.

In the international patent application WO 99/60682 a method for determining temperatures, among others average and hot-spot temperature, of an oil-cooled transformer is disclosed. In this application, hot-spot temperatures are obtained without any direct temperature measurements. Instead, transformer terminal voltage, winding current and ambient temperature are measured, and status of ventilators and pumps and position of a step switch are determined. These variables are then fed into a thermohydraulic model, whereby the temperatures are calculated based on transformer losses, heat transfer convection parameters, flow resistance and oil flow. These calculated temperatures may then be used for controlling and operating the power transformer, in order to avoid overheating.

In the two patent U.S. Pat. No. 4,745,571 and U.S. Pat. No. 4,775,245, methods and systems for simulating and controlling the temperature of a fluid-cooled power transformer are disclosed. The methods electronically compute the transformer winding temperature based on a measured top temperature of the fluid and an incremental additional temperature resulting from transformer load currents. These two temperatures are then added and used for controlling indicators, cooling fans and circuit trips. Consequently, the temperature is monitored for controlling the operation of the transformer, in that no temperature damages should occur.

The disclosures discussed above all concern the protection against acute damage of an inductive power device. A too high temperature will according to these disclosures lead to actions of load reduction and/or increased cooling efforts. However, a malfunctioning inductive power device may not necessarily lead to a dangerous heating at all instances. A malfunctioning inductive power device may e.g. operate at a low fraction of its rated capacity and will then despite its defects operate at a permitted temperature. No indication of the defect is detected until the power is increased. At such an occasion, it is often very inconvenient to take the inductive power device out of operation for repair, since it typically coincides with an increased performance demand.

It would therefore be advantageously if one, as a complement to the conventional overtemperature protection devices, could achieve an apparatus for providing information about the actual operation condition, related to heat issues, of the inductive power device at any instant, i.e. a condition diagnosing apparatus.

SUMMARY

An object of the present invention is to provide condition diagnosing of inductive power devices, giving a more complete picture of the operation conditions of the inductive power device at any operational state.

It is a further object of the invention to provide a diagnosing method, which accurately detects equipment malfunctions and/or external factors affecting the operation even in situations when the inductive power device operates with a low power load, Another object of the invention is to provide an early fault detection before severe damages have occurred.

Yet another object of the present invention is to provide apparatuses and methods that may be used in combination with control and simulation systems, thereby giving a more correct and accurate control or simulation, respectively, of the operation of the inductive power device.

The above objects are achieved by apparatuses and methods according to the enclosed claims. In general words, the operation conditions of an inductive power device having power windings immersed in a fluid, being cooled by cooling devices, are diagnosed by obtaining and evaluating expected heat flows into and out from the fluid of the inductive power device, together with an actual and previous heat content of the fluid. Different quantities are used to represent the heat flows.

The actual heat content of the fluid is, in a preferred calculation model, determined from temperature measurements at different positions of the fluid. The actual heat content is typically a sum of several factors, such as the heat generated by the windings, core and other parts of the inductive power device, the cooling effect of the cooling devices and external factors affecting the temperature of the fluid, e.g. ambient temperature or weather conditions, such as sun light.

The previous heat content of the fluid is the heat content of the fluid determined from a calculation, a previous recording or from any other determined time.

The expected heat inflow is preferably determined as an expected amount of heat that is generated by the power windings, core and other inductive power device parts. The calculations are, in a preferred model, based on measurements of the winding current and are therefore dependent on the load of the inductive power device.

The expected heat outflow is preferably determined as an expected cooling capacity provided by the cooling devices. As for the actual heat content, temperature measurements are, in a preferred model, used to estimate the cooling capacity, viz. temperatures of the fluid as well as an ambient temperature.

The heat balance of the inductive power device system is then investigated by comparing and evaluating the obtained quantities in order to detect any non-expected operation conditions. In an ideal situation, the actual heat content of the fluid should nearly be equal to an expected heat content of the fluid, i.e. the previous heat content of the fluid plus the difference between the expected generated heat and the expected cooling capacity. A divergence from equality is an indication of non-expected conditions, including malfunctions of equipment of the inductive power device and/or external factors affecting the operation. This indication may then be used to perform diagnostic actions, such as operating light indicators and/or sending information of the indication to display means, which give an operator information of that some malfunctions may be present. Alternatively, the indication may be used in control or simulation systems, controlling or simulating, respectively, operation of the inductive power device.

Alternatively, another difference, between the expected generated heat and the actual heat content, may be determined. To this difference the previous heat content is added in order to obtain a representation of the actual heat outflow from the fluid and would under optimum conditions be equal to the expected heat outflow, i.e. the expected cooling capacity. A ratio between the actual heat outflow and the cooling capacity may be calculated, giving a normalized indication of the cooling capacity. This ratio would be near one for expected operation, whereas a ratio far below one is an indication of an expected cooling effect of the cooling devices that is lower than the actual generated cooling effect. As a consequence, a malfunction to e.g. the cooling devices may be present. Blocking objects, such as leaves may e.g. obstruct the cooling devices. The normalized measure may influence a visual indicator being switched on or changing color when the ratio is lower than a predetermined threshold value.

As another alternative, a sum of the actual heat content and the cooling capacity may be calculated. From this sum the previous heat content is subtracted in order to obtain a representation of the actual heat flow into the fluid and would then under optimum conditions at least be nearly equal to the expected heat inflow, i.e. the expected heat generated by the windings, core and other inductive power device parts. Once again a ratio may be obtained, but now between the expected generated heat and the actual heat inflow. A ratio lower than one may be an indication of an internal fault or external factors affecting the temperature of the fluid negatively, i.e. increase the temperature.

The present diagnosing method may preferably be performed several times at different ambient conditions and/or at different cooling effects. This gives a more complete picture of the operation conditions of the inductive power device.

The advantages with the present invention is that it provides a condition diagnosing of inductive power devices that is able to detect malfunctions and other effects affecting the operation of the inductive power device even in such situations when most prior art methods fail. This means that a malfunction may be detected and taken care of before the load of the inductive power device increases and the situation becomes critical. Furthermore, the diagnosing may be used as a complement in controlling and simulating the operation of the inductive power device, thereby getting a more accurate control or simulation, respectively, and consequently a reduced risk for operation malfunctions and damages.

SHORT DESCRIPTION OF THE DRAWINGS

The invention together with further objects and advantages thereof, may best be understood by making reference to the following description taken together with the accompanying drawings, in which.

Figure 4:
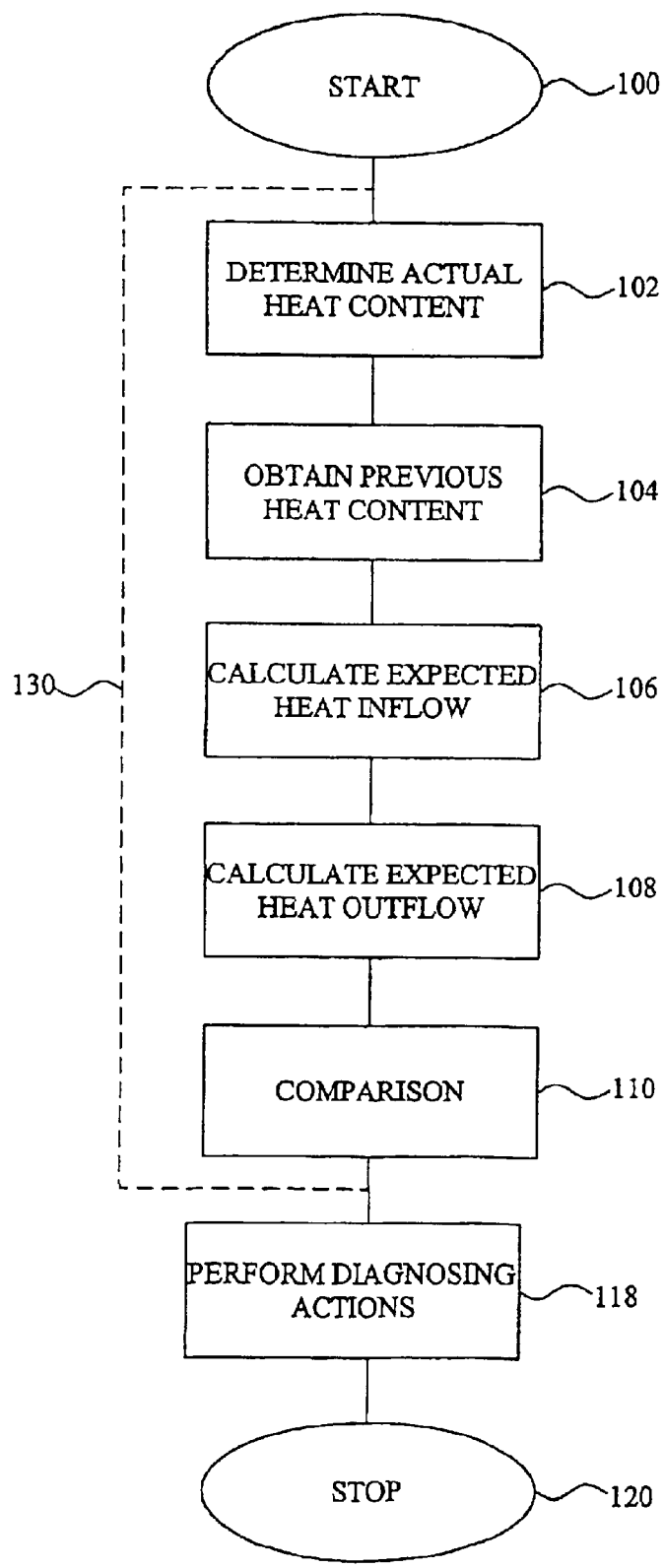
FIG. 4 is a flow diagram of the common general steps of the condition diagnosing method of the present invention.
Figure 5:
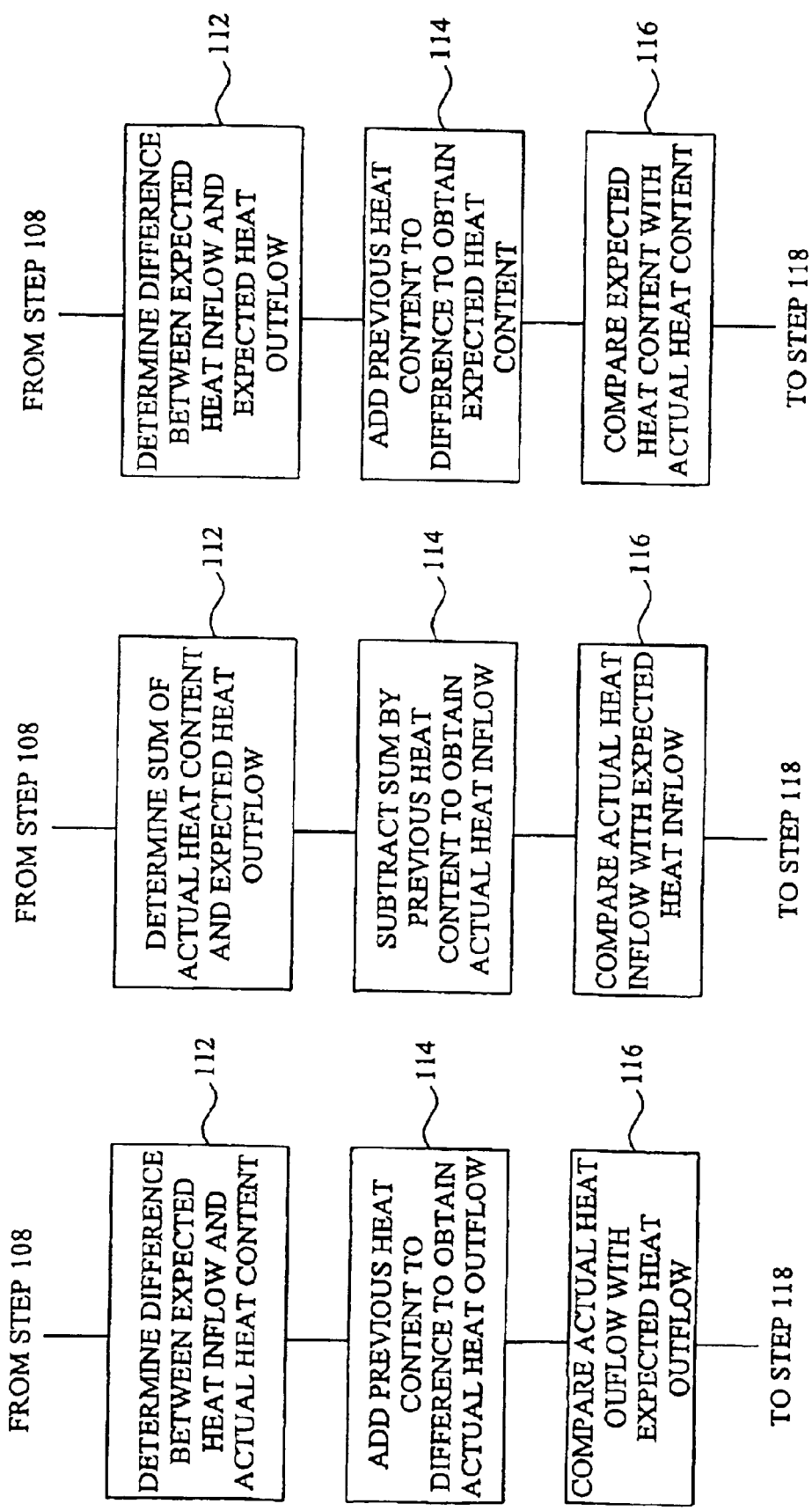
Figure 6:
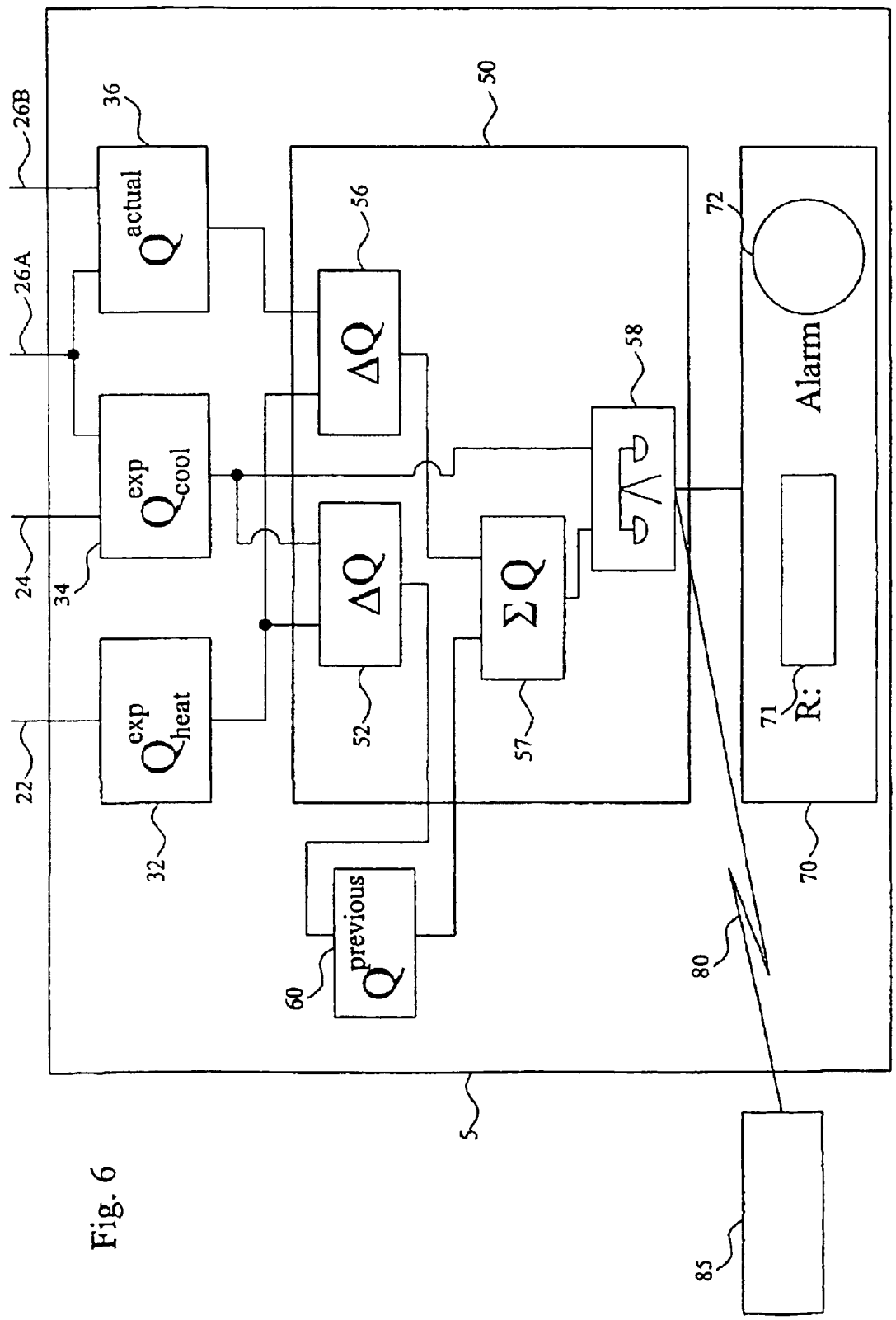
Figure 7:
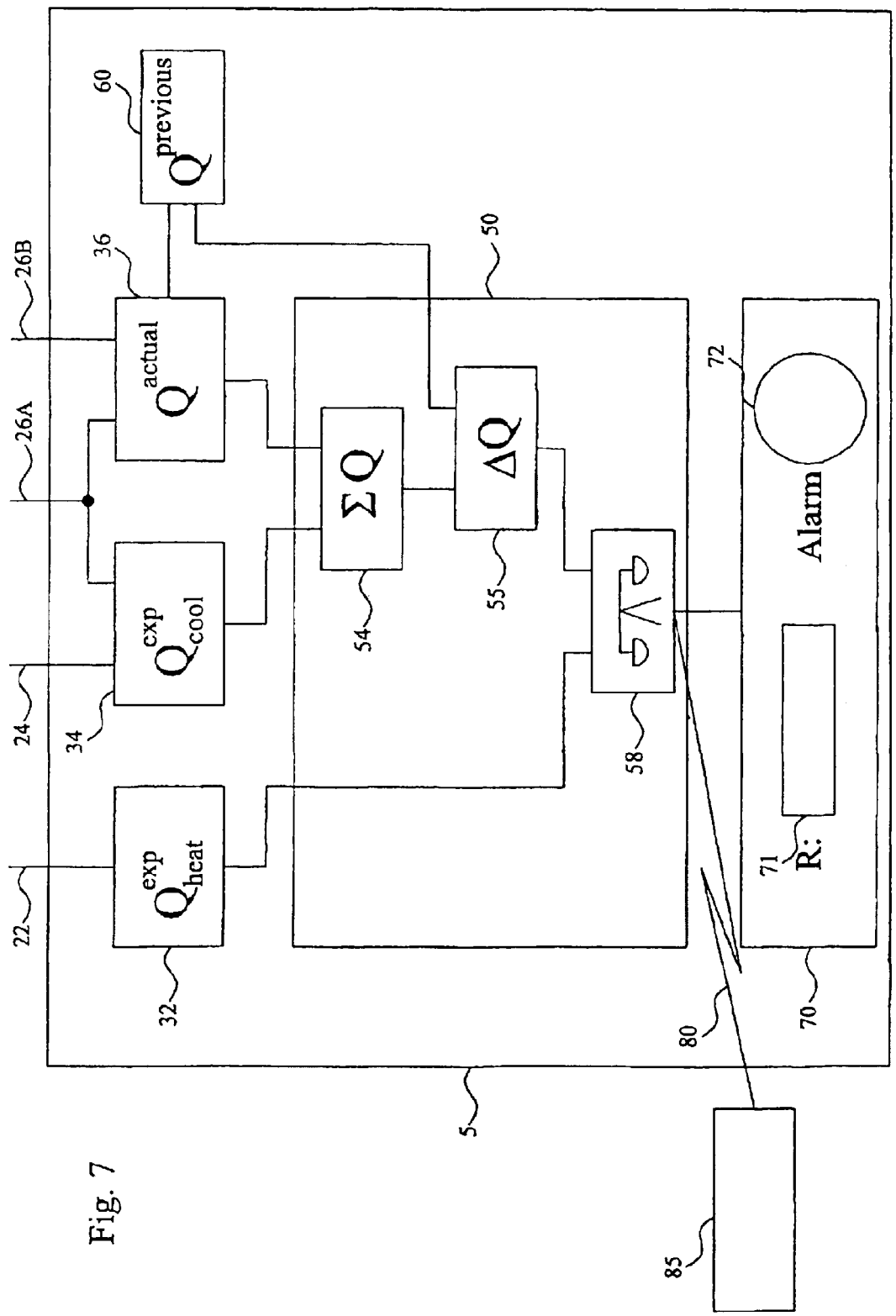
Figure 8:
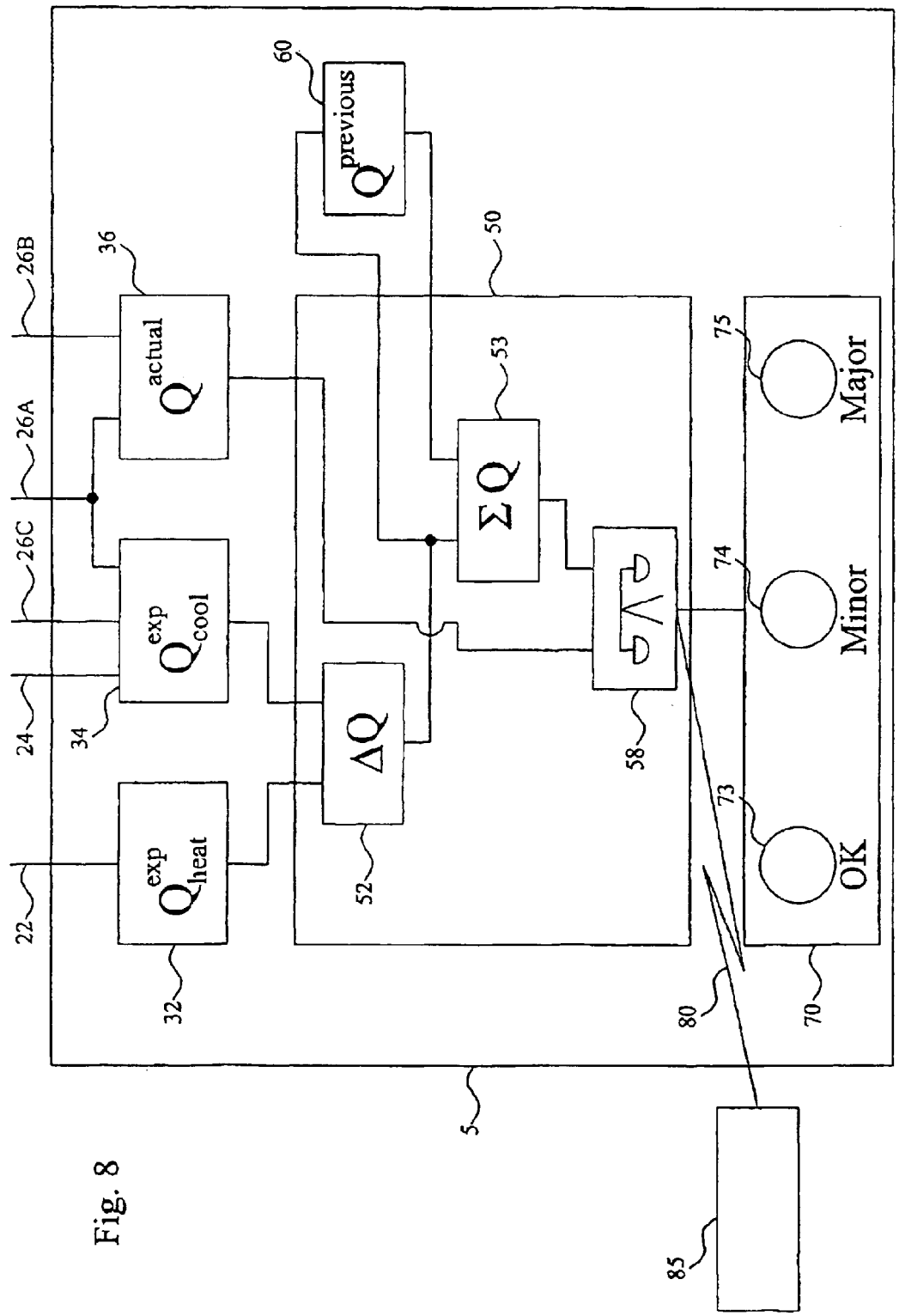

FIGS. 5a–c illustrate flow diagrams of different embodiments of performing one of the steps of FIG. 4;

FIG. 6 is an embodiment of a condition diagnosing apparatus according to the present invention;

FIG. 7 is another embodiment of a condition diagnosing apparatus according to the present invention; and FIG. 8 is yet another embodiment of a condition diagnosing apparatus according to the present invention.

DETAILED DESCRIPTION

Inductive power devices of today are expensive arrangements and are therefore often equipped with protection systems. Such systems are arranged to monitor the operation of the inductive power device and perform control actions when the operation exceeds certain safety operation thresholds. The systems are vital parts of the inductive power device, since an operator upon request wants to operate the inductive power device at maximal rated capacity, trying to achieve as large output effect as possible. Therefore, the need for protection systems in operation of inductive power devices is large, because at maximum or near maximum capacity it is very easy to exceed the safety thresholds. A typical quantity having an operation threshold is as mentioned in the background the temperature of a fluid that cools power windings. If such a temperature increases too much, damage to the inductive power device and associated equipment may arise. Consequently, the goal of many protection systems is to monitor and/or control the temperature of the cooling fluid as well as that of the power windings. The control actions of the systems are basically activated when the temperatures exceed the safety thresholds, and consequently the protection systems may be referred to as acute damage protection systems. The performed emergency actions might include increase of the cooling effort of cooling devices and/or reduction of the load of the inductive power device. However, situations may arise when the emergency actions of prior art monitor and control systems are insufficient or performed too late, leading to damage of the inductive power device.

A typical situation where prior art systems with only top fluid temperature measurements, and the methods on which the systems are based, fail is e.g. when a cooling device, most often some kind of fan, is obstructed or blocked with for instance leaves or similar loose objects. Many of the systems lack methods of controlling the cooling effect of the cooling devices. Instead, only a start pulse of the cooling devices is registered in order to determine when the cooling device is switched on. However, if a cooling device is blocked the start pulse is still registered, but no consideration is taken for the reduced cooling effect, due to the obstruction. As a result, operation of the inductive power device may lead to violation of the safety thresholds, since less than sufficient cooling effect is delivered.

Another typical situation where prior art systems and methods with only top fluid temperature measurements encounter problems is when external factors, such as different weather conditions, including the sun, affect the operation of inductive power device. Since most inductive power device control and monitor systems do not take such external factors into consideration, safety thresholds may consequently be violated.

Since most of the prior art control systems and methods are directed to emergency actions, the systems may come across problems particularly when the inductive power device is loaded at only a fraction of its rated capacity. During such a low power operation, the inductive power device may be operated within its safety thresholds, e.g. below the maximum allowed fluid temperature, even if equipment malfunctions or external affecting factors, as described above, are present. However, if the conditions suddenly change, such as a suddenly increased power load, the malfunctions or external factors may cause the inductive power device to exceed the safety thresholds before the emergency actions of the control systems have an effect. As a result, damages to the inductive power device equipment may arise, leading too increased cost for the operator, not only in the form of cost of repairs but also as lost operation if the damages are so severe that the inductive power device, at least temporarily, must be shut off. Even if the control system actions are efficient enough to save the inductive power device from damage, the detection of the malfunction often comes at an inconvenient moment.

The present invention is directed to another aspect of operation of inductive power devices than the prior art systems, briefly described above. Whereas the prior art systems concern emergency and acute damage protection, the present invention relates to a condition diagnosing of heat status of inductive power devices. Malfunctions and other factors that possibly may lead to equipment damages may be detected at an early stage by the condition diagnosing, even at low power load, i.e. long before the risk for damages actually occurs. The present invention will give an operator indications of the operation conditions of the inductive power device during operation. These indications may then be used for monitoring and/or controlling, continuously or at intermittent occasions, operation of the inductive power device and may consequently be used for alarming the operator if the operation conditions are such that safety threshold may be violated if the power load increases. The operator may then perform required actions to repair or compensate for the faulty conditions before costly damages occur. Such actions can then be scheduled to a convenient moment in the operation of the inductive power device. The indications may also be used in calculating a forecast of hot-spot temperatures and loading capability of the inductive power device.

Figure 1:
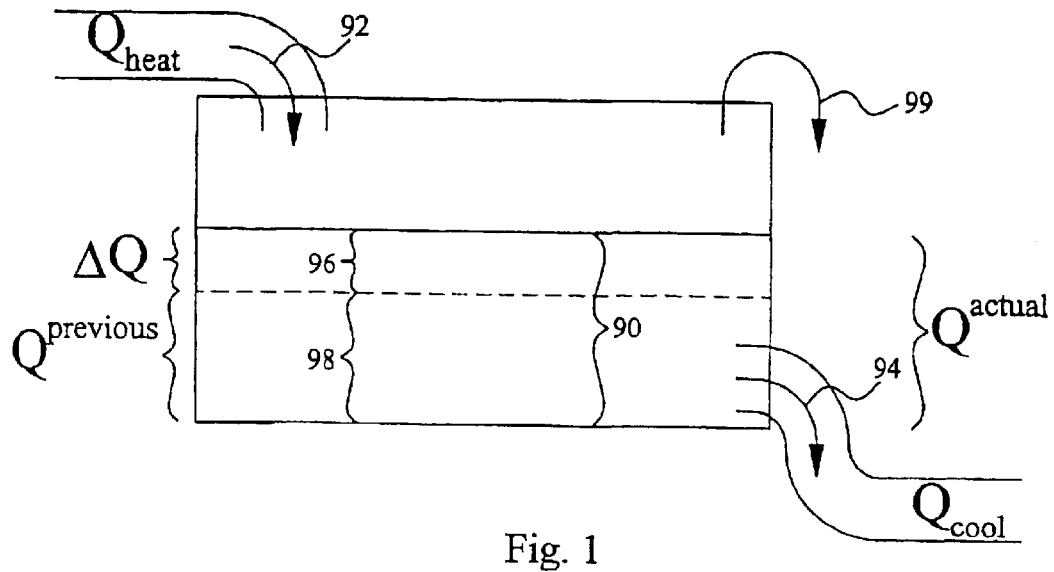
FIG. 1 is a schematic overview of heat flows in an inductive power device system.

Referring to FIG. 1, the basic principle of the condition diagnosing of the present invention is illustrated. FIG. 1 schematically illustrates the flows of heat into and out from a fluid that cools an inductive power device. A heat inflow 92 to the fluid is basically a sum of the heat generated by the power windings, core and other parts of the inductive power device and external factors that affect the temperature the fluid, e.g. the sun and the air temperature. A heat outflow 94 basically represents the cooling effect mainly of cooling devices associated with the inductive power device. During operation the actual heat content 90 of the fluid dynamically changes as the heat inflow 92 and outflow 94 changes. This change 96 in heat content, i.e. the difference between the actual heat content 90 and a previous heat content 98, may either be positive or negative, depending on whether it is the inflow or outflow of heat, which both are positive or zero amounts, that is the largest.

The condition diagnosing of the invention calculates an expected heat inflow and an expected heat outflow, preferably based on calculation models of the heat generation of the windings, core and other parts of the inductive power device and the cooling effect of the cooling devices, respectively. These expected heat flows are then compared and evaluated together with the actual heat content 90 and the previous heat content 98 of the fluid. During expected correct operation, without any equipment malfunctions and/or external affecting factors, the actual heat content 90 would be nearly equal to the previous heat content 98 plus the expected resulting change in heat content, i.e. the expected heat inflow subtracted by the expected heat outflow. A divergence therefrom may be an indication of equipment malfunctions and/or other factors, affecting the operation of the inductive power device. Consequently, the condition diagnosing compares and evaluates heat flows in the inductive power device system, and derives indications of heat balances of the system. This is in contrary to prior art systems that mainly are directed to temperature measurements and temperature protection. The emergency actions of these prior art systems are to reduce the temperature, i.e. the actual heat content 90, of the inductive power device. Their main goal is therefore to prevent the heat 90 of the inductive power device or top fluid and winding hot-spot temperatures from becoming too large, which is schematically illustrated with the arrow 99.

The condition diagnosing of the present invention will now be described with an inductive power device in form of a power transformer. As a person skilled in the art understands, a transformer is merely an illustrative embodiment of an inductive power device, to which the present invention may be applied. The invention is therefore not limited to transformers, but may also be applied to other inductive power devices, such as reactors.

Figure 2:
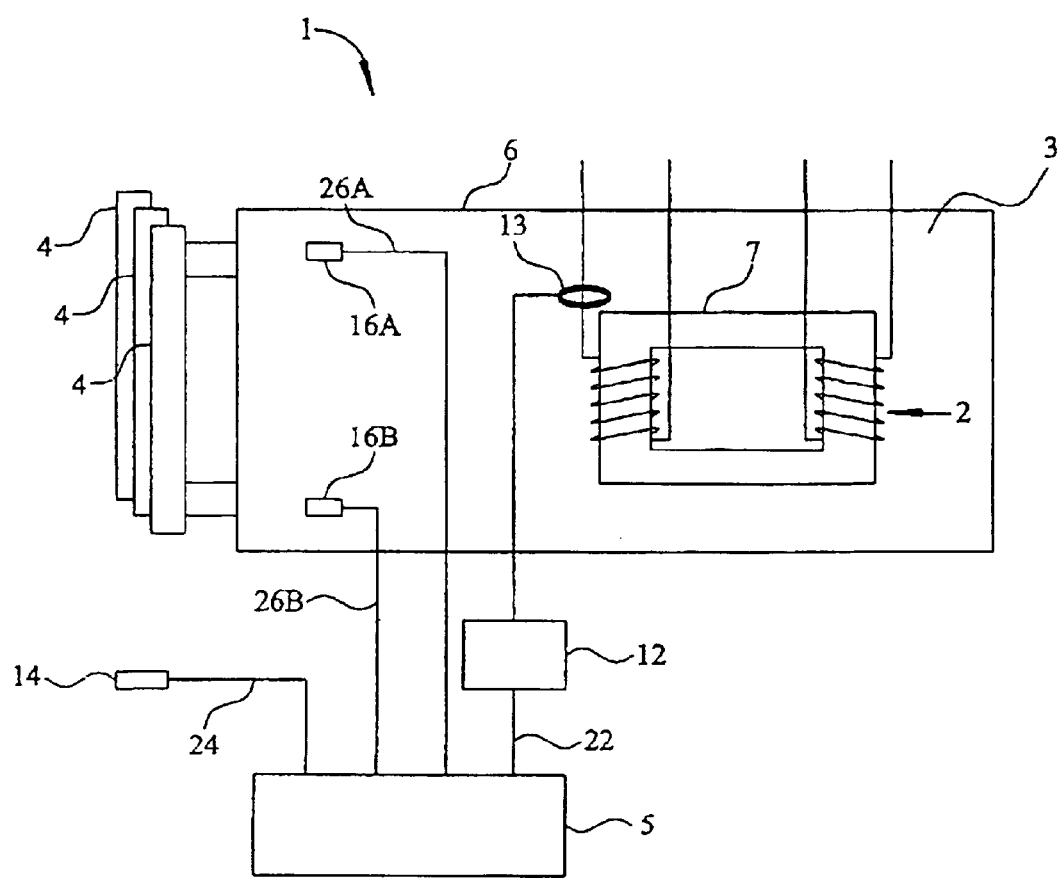
FIG. 2 is a schematic drawing of a part of a power transformer, provided with cooling devices and sensors.

Referring to FIG. 2, a power transformer 1 with its power windings 2 immersed in a cooling fluid 3, e.g. oil, is illustrated. The power windings 2 are wound around a core 7, e.g. an iron core. The fluid 3 is cooled by a number of cooling devices 4, which may comprise fans, cooling fins, radiators or similar devices. The cooling devices 4 cool a flow of fluid from the transformer tank 6, containing the windings 2, the core 7 and the fluid 3. Typically, fluid from the upper part of the tank 6 goes to the cooling devices 4, in which the fluid 3 is cooled, before it is brought back to the lower part of the tank 6. This cooling performance is in many cases necessary since the windings 2 and the core 7 become heated during operation and thereby heat the surrounding fluid 3. If no additional cooling than normal heat dissipation through the walls is performed, the temperatures of the fluid 3 and the windings 2 will in many cases increase so much that they will cause damages to the immersed transformer 1 and associated equipment.

The transformer of FIG. 2 is provided with a number of sensors registering temperatures of the fluid 3, ambient temperature, as well as the load of the power windings 2. The temperatures of the fluid 3 are measured by thermometers 16A, 16B. The thermometer 16A is positioned in the upper part of the tank 6. The temperature is thus a good representation of the highest temperature of the fluid anywhere in the system as well as of the temperature of the fluid entering the cooling devices 4. The thermometer 16B is positioned in the lower part of the tank 6. The temperature is thus a good representation of the fluid in the bottom of the tank 6.

The ambient temperature is a measure of the temperature of the air surrounding the transformer 1. This temperature is measured by a thermometer 14 that is arranged in vicinity of the transformer tank 6, in contact with the surrounding air. This temperature is also the reference temperature of the cooling devices 4.

To get a direct estimation of the load of the windings 2, the winding current is measured by a pick-up coil 13, in turn monitored by e.g. an amperemeter 12 or similar current measuring means. Measuring current in other windings or with the knowledge of tap-changer position, the complete load of the transformer 1 is known.

The data registered by the sensors is then forwarded, on temperature connections 24, 26A, 26B and current connection 22, to a condition diagnosing apparatus 5, which may be provided in connection to the transformer tank 6, implemented as whole in remote control systems or implemented partly in connection to the transformer tank 6 and partly in remote control systems.

The condition diagnosing method of the present invention will now be described in more detail. As briefly mentioned above, the condition diagnosing uses expected heat flows into and out from the cooling fluid of the transformer as well as the actual and previous heat content of the fluid to obtain indications of the heat balance of the fluid.

The actual heat content $Q^{actual}$ is typically a sum of several different contributions affecting the temperature of the fluid, such as the heat generated by the windings, core and other parts of the transformer, the cooling effect of the cooling devices and external factors e.g. the sun. The actual heat content $Q^{actual}$ may, in a preferred calculation model, be expressed as a sum of an actual heat content in the top $Q_T^{actual}$ and bottom $Q_B^{actual}$ of the tank. The actual top $Q_T^{actual}$ and bottom $Q_B^{actual}$ heat contents may in turn be determined from measurements of temperatures of the fluid, more precisely a top fluid temperature $T_T$ and a bottom fluid temperature $T_B$. The previous heat content $Q^{previous}$ of the fluid may likewise be expressed as a sum of a previous top $Q_T^{previous}$ and bottom $Q_B^{previous}$ heat content. The previous heat content $Q^{previous}$ is obtained from a previous recording, a calculation or from any other determined time. Consequently the actual $Q^{actual}$ and previous $Q^{previous}$ heat contents are preferably expressed as:

$$Q^{actual} = Q_T^{actual} + Q_B^{actual}$$

$$Q^{previous} = Q_T^{previous} + Q_B^{previous},$$

and the actual top $Q_T^{actual}$ and bottom $Q_B^{actual}$ heat contents may be determined as:

$$Q_T^{actual} = \alpha m_{fluid} c_{fluid} \hat{T}_T$$

$$Q_B^{actual} = (1-\alpha) m_{fluid} c_{fluid} \hat{T}_B,$$

where $C_{fluid}$ and are a specific heat capacity and a mass of the fluid, respectively, $\hat{T}_T$ and $\hat{T}_B$ are the average top and bottom fluid temperatures, respectively, and $\alpha$ and $1-\alpha$ are the top and bottom fluid fraction of the total fluid in the transformer. In the above model of the actual top $Q_T^{actual}$ and bottom $Q_B^{actual}$ heat contents, the average fluid temperatures $\hat{T}_T$, $\hat{T}_B$ are multiplied with the mass $m_{fluid}$, the specific heat capacity $C_{fluid}$ and respective fraction $\alpha$, $1-\alpha$ of the fluid. If radiators are used as cooling devices, the fluid temperature increases substantially linearly as one moves from the bottom of the fluid tank to the top thereof. But for e.g. fans the situation is different. Then the temperature distribution in the top and bottom fluid fraction, respectively, is fairly homogenous and it is often the amount of fluid in respective fraction that may change. As a consequence, at or near steady-state, one or a few temperature measurements at different positions in the top and bottom the fluid may be sufficient to get good representations of the average top $\hat{T}_T$ and bottom $\hat{T}_B$ temperature, respectively. During non-steady-state operation, more temperature measurements at different positions are necessary to get a more accurate picture of the temperature distribution in the top and bottom fluid, and consequently a better representation of the average temperatures. This is simply solved by arranging more temperature sensors, i.e. thermometers, at different positions and/or depths in the tank. The values of all or some of these temperature measurements may then be used in the calculation of the average temperatures $\hat{T}_T$, $\hat{T}_B$. In the different operation modes of the inductive power device, the value of $\alpha$ may be any number ranging from 0 to 1. A larger value implying a larger fraction of the fluid in the top of the container, whereas a smaller value implies a larger bottom fluid fraction. The specific heat capacity $c_{fluid}$ and the mass $m_{fluid}$ are characteristic properties of the fluid used and are normally obtained from the transformer manufacturer, from standard literature or by measurements. Since an object of the present invention is to detect any problems causing a non-expected operation before the malfunctioning situation becomes critical, the measured fluid temperatures most often are lower than the alarm temperature thresholds of prior art actute damage protection systems.

The very first previous heat content $Q^{previous}$ of the fluid is easily and accurately calculated from temperature measurements e.g. at starting or restarting of the transformer. As for the actual heat content $Q^{actual}$, an average top and bottom temperature may preferably be determined in order to calculate the previous top $Q_T^{previous}$ and bottom $Q_B^{previous}$ heat content, respectively. For an example, the previous top $Q_T^{previous}$ and bottom $Q_B^{previous}$ heat content may be determined using a similar calculation model as for the actual top $Q_T^{actual}$ and bottom $Q_B^{actual}$ heat contents above. The previous heat content $Q^{previous}$ is then obtained by adding the two calculated heat contents $Q_T^{previous}$, $Q_B^{previous}$. Afterwards, the obtained value $Q^{previous}$ may be stored in a memory. A subsequent previous heat content $Q^{previous}$, used in a subsequent condition diagnosing, may be calculated starting from the stored value of the previous heat content $Q^{previous}$ and adding the change in heat content of the fluid, i.e. the heat inflow $Q_{heat}^{expected}$ subtracted by the heat outflow $Q_{cool}^{expected}$. It would also be possible to intermittently set the previous heat content $Q^{previous}$ equal to the actual heat content $Q^{actual}$, which is derived from the temperature measurements. The actual heat content $Q^{actual}$ then becomes the previous actual heat content $Q^{previous}$ for a subsequent determining procedure.

The expected heat inflow to the fluid is preferably calculated as an expected amount of heat $Q_{heat}^{expected}$ generated by the windings, core and other transformer parts. This expected heat $Q_{heat}^{expected}$ is the expected or rated heat that is caused by the load of the transformer. In a preferred calculation model, calculations of the expected heat $Q_{heat}^{expected}$ is based on a sum of eddy losses, core losses and resistive losses. Electrical currents circulating in the core of the transformer as a result of induction causes the eddy losses. These currents produce heat in the core and the power windings. The core losses are due to hysteresis, which is a property of the magnetic substance of the core. This property causes the magnetization to lag behind the magnetizing force and heat is dissipated from the core to the fluid. The resistive losses are heat generated by currents through the power windings, due to the winding resistance. All these heat losses depend upon the winding current, which therefore is measured by an amperemeter or similar current measuring means. By further multiplying the losses with a duration of the time interval, during which the current and also in some cases a voltage is determined, the expected amount of generated heat $Q_{heat}^{expected}$ during that time interval is obtained. Other, more sophisticated calculation models may be used that e.g. integrate the winding current over time, which will be described in more detail further on.

The expected heat outflow from the fluid is preferably represented as an expected cooling capacity $Q_{cool}^{expected}$ of the cooling devices and other parts of the transformer that contributes to the cooling. The expected cooling capacity $Q_{cool}^{expected}$ is in a preferred calculation model calculated from temperature measurements. In most cases, an ambient temperature $T_{amb}$ of the surrounding air is needed in the calculations. The expected cooling capacity $Q_{cool}^{expected}$ can as a simplification be calculated as follow:

$$Q_{cool}^{expected} = K_1(\hat{T} - T_{amb})^\beta \Delta t,$$

where $\beta$ is a constant associated with the particular cooling devices used, $K_1$ depends among others on the number of cooling devices operating and the viscosity of the fluid, and are normally provided by the manufacturer or can be determined empirically. As for the actual heat content of the fluid, an average temperature $\hat{T}$ of the fluid is calculated. This temperature $\hat{T}$ is the average temperature of the fluid passing past the cooling devices. The temperature $\hat{T}$ may, in a preferred model, as a simplification be expressed as:

$$\hat{T} = \frac{T_T + T_C}{2},$$

where $T_T$ is a top temperature of the fluid in the transformer tank and $T_C$ is a temperature of the fluid in the vicinity of or in the outlet from the cooling devices. The temperature $T_C$ is usually calculated from other measured temperatures of the fluid and the current through the windings. It may instead be possible to arrange a thermometer in the vicinity of or in the outlet from the cooling devices. The temperature $T_C$ is then not calculated but measured. Likewise, instead of using the top fluid temperature, a thermometer may be arranged in the vicinity of or in the inlet to the cooling devices. In such a case, more accurate temperatures of the fluid entering and leaving the cooling devices are obtained. But, using thermometers to obtain $T_C$ and/or measure the temperature of the fluid entering the cooling devices, requires that one or two thermometers are arranged in the inlet and/or outlet for each cooling device. This will lead to increased equipment costs. Therefore, calculations may be preferred instead of real measurements. The ambient temperature $T_{amb}$ is then subtracted from this average temperature $\hat{T}$ in order to get a temperature difference between the fluid and the air surrounding the cooling devices. By further multiplying the calculated difference with a duration of the time interval $\Delta t$ during which the temperatures $\hat{T}$ and $T_{amb}$ are determined, the expected heat outflow to the fluid $Q_{cool}^{expected}$ during that time interval is obtained. As for the expected heat inflow $Q_{heat}^{expected}$ other more sophisticated calculation models may be used that e.g. integrate the temperatures $\hat{T}(t)$ and $T_{amb}(t)$ over time.

A comparison between the expected heat inflow, outflow, represented as the expected amount of generated heat and the expected cooling capacity, respectively, and the actual and previous heat content is performed to get indications of heat balances of the transformer system. Since the quantities involved are based on models of well operating devices, this comparison gives information of the operation conditions of the transformer. Consequently, if the modeled heat balance is not balanced, i.e. the expected heat inflow plus the previous heat content subtracted by the expected heat outflow differs from the actual heat content, the calculation model for the expected generated heat and/or the expected cooling capacity is probably incorrect. The incorrectness is an indication of that the operation conditions of the transformer are not as expected. Possible causes to the non-expected difference in the calculations include a reduced cooling capacity of the cooling devices, external factors affecting the temperature of the fluid and faults to the transformer itself. Based on this comparison diagnosing actions including indication of error functioning may be performed. This indication may be in the form of visual/audio indicators, alarming an operator of the non-expected operation by e.g. lightning an alarm lamp. Information of this indication may also be transmitted to a remote display means and/or portable display means carried by an operator. The operator may then correct the malfunctions or may compensate for the external factors during operation of the transformer.

The comparison between the calculated quantities, the actual and previous heat content, the expected generated heat and the expected cooling capacity, may in a first embodiment be performed by first calculating a difference between the expected generated heat and the actual heat content. To this difference the previous heat content is added in order to, in theory, to obtain the actual amount of heat that is removed from the system in one or another way. The calculated actual amount of removed heat is then compared with the expected cooling capacity, which corresponds to the expected amount of heat removed mainly by the cooling devices of the transformer. The cooling devices are in a typical case responsible for the major part of the cooling. If the transformer is operating as expected the actual amount of removed heat is therefore, at least nearly, equal to the expected cooling capacity. A divergence from equality indicates that the expected removed heat, removed by the cooling devices, differs from the actual removed heat. If a divergence is present the expected cooling capacity is most often larger than the actual amount of removed heat, or expressed differently the expected removed heat is larger than the actual removed heat. The cause of this divergence from equality may be malfunctioning or obstructed cooling devices, which thereby deliver less than expected cooling effect The condition diagnosing may then indicate this non-expected incorrect operation condition giving an operator indications of the presence of possible malfunctions of the cooling devices.

If it is concluded that a non-expected operation condition is present, it may be possible to decide whether the non-expected condition is due to malfunctioning cooling devices or malfunctioning pumps. From the expected heat inflow and outflow and the previous heat content, an expected top and bottom fluid temperature, respectively, may be calculated. The difference between these expected fluid temperatures is then compared with a corresponding actual temperature difference between the measured top and bottom fluid temperature. If the expected temperature difference is larger than the actual temperature difference, a too low cooling of the fluid is present. As a consequence, a malfunctioning may be present to one or several of the cooling devices. The cooling device or devices may be obstructed with dirt, leaves and other material or there may be an equipment damage present in the cooling devices. On the other hand, if the expected temperature difference is smaller than the actual temperature difference, the pumping of warm fluid from the top of transformer tank past the cooling devices and to the bottom of the tank is too low. Such a situation may arise when a pump that pumps fluid from the transformer tank to the cooling devices is out of order. Thus, the condition diagnosing method of the present invention may not only detect malfunctions to the transformer but may actually pinpoint the exact cause and location of the malfunctions causing non-expected operation conditions.

By dividing the calculated actual amount of removed heat with the expected cooling capacity, a ratio that is representative of the cooling capacity of the cooling device is obtained. In an ideal expected situation this ratio would be near one, but if some malfunction to the cooling device is present, the ratio will become significantly lower than one. The actual value of this ratio may be displayed by indicators, giving an operator an indication of the operation of the cooling devices.

Ratios higher than one may also be possible. Such situations can e.g. occur if the transformer tank is exposed for cold air, in particular streaming cold air, or other cooling actions such as rain. However, ratios higher than unity may also depend on that the models of the quantities used for obtaining the denominator do not agree with reality.

Figure 3:
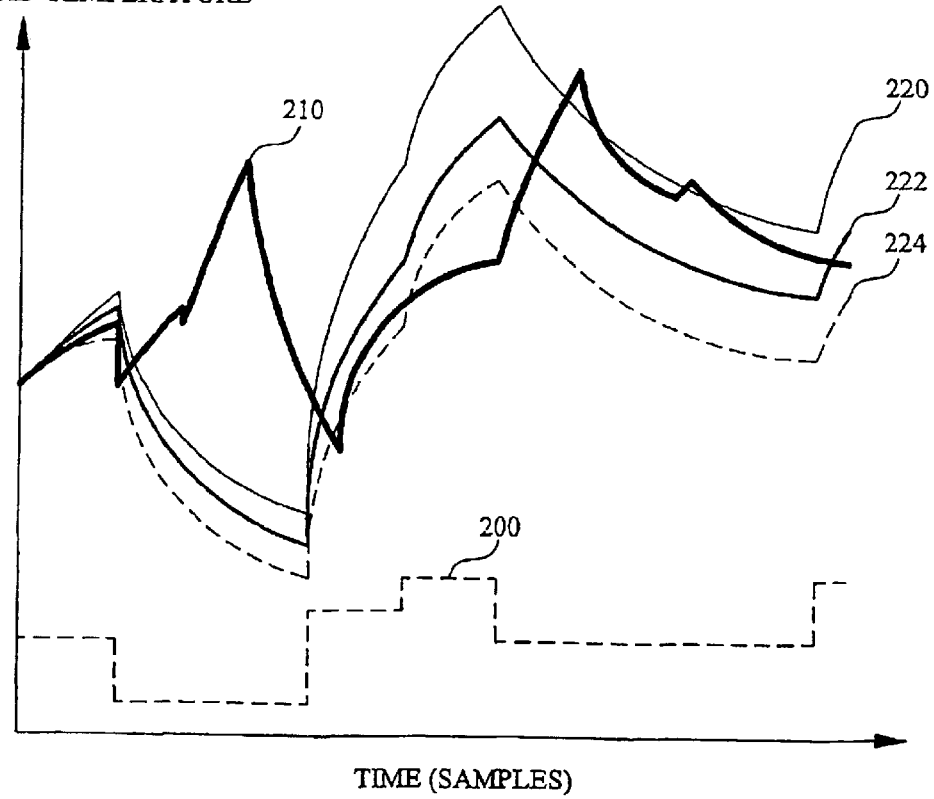
FIG. 3 is a diagram of a measured top fluid temperature of a transformer and calculated top fluid temperatures for different cooling capacities versus time.

Since the calculations and determinations are based on a mixture of measurements and models, the uncertainty of a single measurement may in some situations not be sufficient to get a good picture of the operation condition of the transformer. This may be the case, in particular when the operational conditions change, such as just after a cooling device has been disconnected or a further cooling device has been connected. However, the general behavior over time is much more accurate. In order to get an indication of the cooling capacity that is based on time dependent measurements instead of only calculations at one measurement occasion, several calculations of the heat generated by the transformer windings and core and the cooling effect of the cooling devices may be performed over time. At each time instant, or sample, the top temperature of the fluid is determined from the calculated generated heat and cooling effect. The top fluid temperature is also calculated for different cooling capacities. This is simply performed by multiplying the calculated cooling effect with different cooling capacities, i.e. multiplication with different constants typically ranging from e.g. 0.5 to 1.1. Besides the different calculated top temperatures of the fluid this top temperature is also actually measured by thermometers at the different time instants (samples). By then plotting the calculated top fluid temperature versus time (samples) for each cooling capacity, a family of curves may be obtained as in FIG. 3. In the diagram the x-axis represents time, or more precisely the different measurement samples over time, whereas the y-axis represents the top fluid temperature. In the diagram, the calculated curve 220 represents a cooling capacity of 1, whereas curves 222 and 224 represent a cooling capacity of 0.9 and 0.8, respectively. The actually measured top temperature is represented by curve 210. The dashed line 200 in the bottom of the diagram represents the load of the transformer over time. From such a graph, the measured top fluid temperature may be curve fitted, using any suitable curve-fitting algorithm, to each member of the family of calculated temperatures. The result of such a curve fitting is the calculated curve best fitting the actual measured curve. The cooling capacity, i.e. the constant that the cooling effect was multiplied with, associated with the best-fitted calculated curve is then a good representation of the cooling capacity of the cooling devices.

If the transformer is cooled by more than one cooling device and/or if one cooling device may be operated at different fractions of its rated maximal capacity, the condition diagnosing method may be repeated several times, but with different cooling devices operating and/or operating at different fractions of the maximum capacity. A restart of the calculations in the condition diagnosing method preferably takes place when a cooling device is started or at some regular time. This makes it possible to distinguish faults in different cooling devices. By also performing the method several times in different configurations, it is possible to obtain the cooling capacity for each cooling device and/or each operating effect fraction. In such a way it is possible to determine in which cooling devices any faults are present, or if the faults are present in any other parts of the system.

In another embodiment of the comparison between the actual and previous heat content, expected generated heat and cooling capacity, the actual heat content subtracted by the previous heat content is added to the expected cooling capacity. The resulting sum will in principle be a representation of the actual amount of heat that is introduced into the transformer system. This determined actual amount of introduced heat is thereafter compared with the expected generated heat, which corresponds to the expected amount of heat generated by the power windings, core and other transformer parts. Ideally, the actual amount of introduced heat is of course equal to the expected generated heat. But external factors, e.g. the sun, which affect the temperature of the cooling fluid may cause a divergence from equality, i.e. the actual heat inflow is larger than the expected heat inflow. The condition diagnosing may then indicate this non-expected incorrect operation condition giving an operator indications of the presence of possible external factors that affect the temperature and therefore the operation conditions of the transformer. If a rapid disagreement appears, without any plausible cause from external factors, acute errors of the transformer may be possible. In such cases, more elaborate methods for locating faults may be applied to localize the fault.

As for the first embodiment above, a ratio, but now between the expected generated heat and the actual amount of introduced heat, may be determined. Ideally this ratio would be close to one but if external factors are present the ratio is most often lower than one. In some unusual situations the ratio may actually be larger than one, indicating a cooling effect not originating from the cooling devices, but from external factors. This may be the case during rain, leading to an efficient heat transfer from the fluid and the transformer to the water droplets and the surrounding air.

As for the cooling capacity, several measurements over time may be performed and a family of curves may be plotted versus time. From curve fitting of these curves the ratio that is representative of the expected generated heat, may then be obtained, similar to the cooling capacity above.

This embodiment of the present invention may be performed several times but during different ambient conditions, e.g. during a sunny day, a cloudy day and/or night, when the effect of external factors is expected to be different. The embodiment may advantageously be performed during the night when the sun, which may affecting the operation of transformer, is absent. If, during such ambient conditions, a non-expected incorrect operation condition is detected, this may be an indication of transformer equipment malfunctions, such as pump or cooling device malfunctions.

In yet another embodiment of the comparison of the condition diagnosing method a difference is determined between the expected generated heat and the expected cooling capacity. To this determined difference the previous heat content is added. The result typically corresponds to the expected heat content of the fluid, and is compared with the actual heat content of the fluid calculated from measurements. In ideal expected conditions the expected heat content is equal to, or at least near, the actual heat content. A divergence therefrom is an indication of undesirable conditions, including equipment malfunctions and external factors, and diagnosing actions should be performed.

Since it is possible not only to calculate heat flows and contents from temperatures, but also the opposite, i.e. calculate temperatures from heat flows and contents, a comparison between actual measured temperatures and expected calculated temperatures may be performed. As mentioned above, the actual and previous contents may be expressed as actual and expected top and bottom heat contents. Such an approach is also possible for the expected heat inflow and outflow. An expected top heat content may then be obtained by sunning the previous top heat content and an expected top heat inflow, followed by a subtraction by an expected top he at outflow. An expected bottom heat content may likewise be obtained by using bottom heat contents and flows instead of the top heat contents and flows. From the expected top and bottom heat contents an expected top and bottom temperature, respectively, may be calculated. These expected temperatures can then be compared with the actual measured top and bottom temperature, preferably the average top and bottom temperature. From such a comparison it may be possible to detected non-expected operation conditions, in form of a non-expected fluid flow through the cooling devices. If the fluid flow is lower than expected, the actual temperature difference between top and bottom fluid in the transformer tank is larger than the expected calculated difference. Such a situation may arise when a pump, pumping fluid the tank to the cooling devices, is out of order. On the other hand, if the actual temperature difference is smaller than the expected calculated difference, a too low cooling of the fluid is present. This may be the case when one or several cooling devices are malfunctioning. The condition diagnosing of the present invention may therefore be used for detecting malfunctions in the transformer equipment, e.g. pumps.

Monitoring of temperatures is therefore basically equivalent to monitoring of heat contents.

It is apparent for the person skilled in the art that the different embodiments of the present invention above may be performed either alone or combined. By combining the different embodiments of the condition diagnosing a more correct and complete picture of the operation conditions of the transformer is obtained, giving information of both external (ambient) and internal (faulty equipment) conditions.

The calculation models above for calculating the actual and previous heat content, expected heat inflow and expected heat outflow, are merely illustrative examples of possible thermodynamic models. Several such models exist that take more or less factors into consideration in the calculations and give a more or less accurate calculation.

In the model for the actual heat content above, the average top and bottom temperatures are calculated from temperature measurements in the top and bottom of the transformer tank, respectively. As a person skilled in the art understands, more thermometers at different top and bottom positions gives better basic data for the temperature averaging. Particularly in non-steady-state operations, the top and/or bottom fluid temperature may change unlinearly in a longitudinal path from a transformer tank wall to an opposite tank wall. Measurements form several thermometers may then preferably be used in the averaging, whereas during or near steady-state only one or a few top and bottom positioned thermometers may be sufficient.

In the calculation model for the expected heat inflow presented above, the resistive, eddy and core loses generated by the windings, core and other transformer parts during a time interval is determined. In order to get the heat inflow the losses are multiplied with the time interval. Since the losses depend upon the winding current, the average winding current during that time interval may be used. A better model would be to calculate the losses at one instant, using the winding current at that particular instant, and then once more calculate the losses at another instant, separated by a time interval from the first instant. In order to get the generated heat the two time-separated calculated losses are averaged and multiplied with the time interval separating them. Another model could be based on several measurements of the winding current over time and calculates the generated losses at each measurement time. The generated heat is then obtained by averaging all calculated losses and multiplying by the length of the time interval. If the winding current may be expressed as a function of time the heat inflow may be obtained from integration over time.

Just as for the actual heat content and the expected heat inflow, different calculation models exist for the expected heat outflow and may be used by the present invention. Actually, any suitable calculation model may be used by the condition diagnosing and are therefore included in the scope of the present invention.

The condition diagnosing method of the present invention is summarized in FIGS. 4 and 5a–5c. The diagnosing starts in step 100. In step 102, the actual heat content of the cooling fluid is determined, preferably from temperature measurements of the fluid. The previous heat content is obtained in step 104, from a calculation or from a memory. The expected amount of heat flowing into the fluid is calculated in step 106. Typically, the calculations of the expected heat inflow are approximated by the heat generated by the transformer windings, core and other transformer parts and are therefore based on the current through the windings and in some models also a voltage. In step 108 the expected amount of heat flowing out from the fluid is calculated. Preferably, this is approximated by the expected cooling capacity of the cooling devices, and the calculations are preferably based on temperature measurements associated with the cooling devices. A comparison between the determined actual and previous heat content, expected heat flowing into and out from the fluid is performed in step 110. Based on this comparison, diagnosing actions are performed in step 118, including indication of error functioning and sending information thereof to display means. This indication may be in the form of visual/audio indicators, such as alarm lamps, alarming an operator of a possible non-expected operation. The diagnosing method is completed in step 120.

FIGS. 5a to 5c describe preferred manners to accomplish the comparison step 110 in FIG. 4 in more detail.

In the embodiment of FIG. 5a, a difference between the expected heat inflow and the actual heat content is calculated in step 112. To this difference the previous heat content is added in step 114 in order to obtain an actual heat outflow. This obtained actual heat outflow is then, in step 116, compared with the expected heat outflow to get indications of the operation conditions of the transformer. The performed diagnosing actions of step 118 in FIG. 4 are then based on this comparison.

In FIG. 5b another embodiment of the comparison step 110 in FIG. 4 is illustrated. A sum of the actual heat content and the expected heat outflow is determined in step 112. In step 114 the resulting sum is subtracted by the previous heat content in order to obtain an actual heat inflow. The actual heat inflow is in step 116 compared with the expected heat inflow. Information of this comparison is then used to perform diagnosing actions, such as run an alarm if it, from the comparison, is concluded that the operation conditions are non-expected and incorrect Yet another embodiment of the comparison step 110 of FIG. 4 is illustrated in FIG. 5c. In FIG. 5c a difference is determined between the expected heat inflow and the expected heat outflow in step 112. To this difference the previous heat content is added in step 114 in order to obtain an expected heat content. In step 116 the expected heat content is compared with the actual heat content. Based on this comparison the diagnosing actions of step 118 in FIG. 4 are performed, including alarming an operator if the operation conditions are non-expected.

The condition diagnosing method may with advantage be performed several times, which is illustrated by the dashed line 130 in FIG. 4. The diagnosing may also be performed during different operational conditions. Such different conditions may e.g. include different ambient conditions and/or different cooling effects. If the transformer has several cooling devices, the method may be performed with different combinations of cooling devices operating. Also, if the cooling devices may be operated at different fractions of their rated capacity, the method may be performed at such different fractions of maximum cooling effect. This will make it possible not only to pinpoint that or those cooling devices that actually are malfunctioned or blocked, but also get information on the dependence of the actual cooling upon the fraction of the maximum cooling effect.

The method according to the present invention may be implemented as software, hardware, or a combination thereof. A computer program product implementing the method or a part thereof comprises a software or a computer program run on a general purpose or specially adapted computer, processor or microprocessor. The software includes computer program code elements or software code portions that make the computer perform the method using at least one of the steps previously described in FIG. 4 and preferably also in FIGS. 5a–c. The program may be stored in whole or part, on, or in, one or more suitable computer readable media or data storage means such as a magnetic disk, CD-ROM or DVD disk, hard disk, magneto-optical memory storage means, in RAM or volatile memory, in ROM or flash memory, as firmware, or on a data server.

The basic elements of one embodiment of the condition diagnosing apparatus 5 will now be described with reference to FIG. 6. The expected heat inflow represented by the heat generated by the transformer windings, core and other transformer parts is calculated by means 32. The means 32 of the present embodiment uses the current that is measured by amperemeter 12, illustrated in FIG. 1, which is proportional to the current in the windings. A representation of the current of the windings is thereby transmitted from the amperemeter to the means 32 through the current connection 22. The means 32 then uses this value of the winding current to calculate the expected heat generated by the power windings and core.

The expected heat outflow, represented by the cooling capacity of the cooling means is calculated in the means 34. In this embodiment, input data from the thermometers in FIG. 1 is transmitted on the temperature connections 24, 26A to means 34. The means 34 then uses this temperature data to calculate the expected cooling capacity of the cooling devices at the present operation condition.

Means 36 is arranged in the diagnosing apparatus 5 of the present embodiment to determine or at least estimate the actual heat content. As for the means 34, the means 36 uses input data from the thermometers measuring the temperature of the fluid. These measured temperatures are obtained by the means 36 via the temperature connections 26A, 26B.

In the embodiment of the present invention illustrated in FIG. 6 a difference between the calculated expected generated heat from means 32 and the actual heat content, determined by means 36 is determined by means 56 of performance means 50.

A memory means 60, which advantageously is non-volatile is connected to the means 52. This memory means 60 stores information of the previous heat content of the fluid. Information of the difference between the expected heat inflow and outflow, i.e. the expected change in heat content of the fluid, calculated by means 52 is forwarded to the memory means 60 and stored. The previous heat content is then updated by adding the calculated heat difference from means 52 to the stored value of the previous heat content. The result becomes the previous heat content for a subsequent determining procedure.

Means 56 of the condition diagnosing apparatus 5 calculates a difference between the expected generated heat from means 32 and the actual heat content from means 36. To the difference from means 56 the previous heat content from memory means 60 is added by means 57 in order to, in principle, correspond to the actual amount of heat that is removed from the system in one or another way. A representation of this actual removed amount of heat is input to comparison means 58. The comparison means 58 also receives a representation of the expected cooling capacity, from means 34. The comparison means 58 then compares the actual removed amount of heat, with the expected cooling capacity. If the actual removed amount of heat differs from the expected cooling capacity by more than a certain percentage, the operation conditions of the transformer are in this embodiment considered as undesirable and the performance means 50 sends information to indicators 70 and/or signals 80 to remote or portable display means 85 (which will be described in more detail below). The indicators 70 and display means 85 subsequently indicate the undesirable condition as error functioning, giving an operator an alarm signal by e.g. lighting an alarm indicator 72.

In addition, in the present embodiment, the comparison means 58 derives a ratio between the actual removed amount of heat and the expected cooling capacity. This ratio is transmitted to the indicators 70 and/or display means 85 to be displayed as a number on a screen 71. If the ratio differs too much from unity, the alarm indicator 72 is additionally lit. A low ratio may indicate a fault in a cooling device while a high ratio may indicate that non-considered external factors are of importance. An operator may then perform the required actions, e.g. to take care of malfunctions before critical damages to the transformer occur.

FIG. 7 illustrates schematically another embodiment of the diagnosing apparatus 5 with a slightly different performance means 50. Means 54 of the performance means 50 adds the expected cooling capacity from means 34 to the actual heat content, determined by means 36.

A memory means 60, which advantageously is non-volatile is connected to the means 36. This memory means 60 stores information of the previous heat content of the fluid. Information of the actual heat content, calculated by means 36 is forwarded to the memory means 60 and stored. This stored data becomes the previous heat content for a subsequent determining procedure.

From the sum calculated by means 54 the previous heat content from the memory means 60 is subtracted by means 55 in order to obtain a representation of the actual amount of heat that is introduced into the transformer system in one or another way. Comparison means 58 receives representations of both this calculated introduced actual heat from means 55 and the expected generated heat that is obtained by means 32. As for the described embodiment above, the means 58 sends a signal to the performance means 50 if the introduced actual heat differs more than a percentage from the expected generated heat. The performance means 50 then performs the suitable actions, such as send information to indicators 70 and/or transmit a signal 80 display means 85 that in turn may alarm an operator of the present undesirable operation condition.

In addition, the comparison means 58 of the present embodiment may derive a ratio between the expected generated heat and the introduced actual amount of heat. This ratio is transmitted to the indicators and/or display means 70 to be displayed as a number at a screen 71. If the ratio differs from unity too much, an alarm indicator 72 is additionally lit. A low ratio may indicate external factors, e.g. the sun, which increases the temperature of the cooling fluid. An operator may then perform the required actions, e.g. compensate for the external effect by increasing the cooling effort of the cooling devices.

In yet another embodiment of the diagnosing apparatus 5 in FIG. 8 a difference between the expected generated heat and the expected cooling capacity is determined by means 52 of the performance means 50. To this difference the previous heat content from memory means 60 is added by means 53. The result represents the expected heat content of the fluid as calculated from models of heat sources and heat sinks in the cooling system. A representation of this expected heat content is input to comparison means 58. The comparison means 58 also receives a representation of the actual heat content, from means 36. The comparison means 58 then compares the received expected heat content with the measured actual heat content. In an expected steady-state situation without any equipment malfunctions and external factors not covered by the thermodynamic models, the expected heat content is equal to the actual heat content of the fluid. However, if malfunctions in the cooling devices and/or if non-considered external factors affecting the temperature of the fluid are present, the expected heat content differs from the actual heat content.

If the comparison means 58 finds that expected heat content differs significantly from the actual heat content, a notion of a non-expected operation condition is transmitted to the indicators 70 and/or a signal 80 is sent to display means 85. The indicators 70 and display means 85 subsequently indicate the undesirable condition as error functioning, giving an operator an alarm signal—minor fault or major fault—depending on the magnitude of discrepancy. The indicators 70 and display means 85 may in this embodiment include several indicator lamps 73, 74, 75, that may be lit depending on if the operation conditions are OK, indicator 73, or whether some fault is present, indicated with minor fault indicator 74 and major fault indicator 75, respectively.

With reference to FIGS. 6 to 8, the indicators 70 of the diagnosis apparatus 5 may be in the form of visual and/or audio indicators that can alarm an operator that the operation conditions of the transformer are non-expected. In a first embodiment the indicators 70 may be in the form of only indicating if the operation of the transformer is OK or non-expected. This may be indicated by an indicator lamp that, e.g. may be lit during non-expected operation or is lit with different colors depending on the operation conditions. It may also, as in FIG. 8, be possible to have an indicator lamp for each operation condition, e.g. OK 73, minor fault 74 and major fault 75. In addition, a display screen, as the screen 71 in FIG. 6 and 7, may be provided to display actual numbers representing e.g. the cooling capacity of the cooling means or the heat generated by the power windings and core. This gives an operator more detailed information of the operation conditions of the transformer than if only lamp indicators are used. The visual indicators may be complemented with audio indicators, that may give an alarm audio signal if the operation conditions are particular bad, i.e. corresponding to the major fault indicator 75 of FIG. 8. Actually, as a person skilled in the art understands, any form of indicator whether visual, audio or some other type, may be used by the present condition diagnosing.

Instead of or as a complement to the indicators 70 a display means 85 may be used. The signal 80 of a non-expected operation condition is then transmitted as a data signal from the performing means 50 to the display means 85, which may constitute e.g. a remote display means, such as a computer with receiving means and/or a portable display means. The signal 80 may be transmitted as a radio signal, an infrared signal or any other form of electromagnetic signal. The display means 85 may in turn comprise indicators 72, 73, 74, 75 that give a visual and/or audio alarm if the operation conditions of the transformer are non-expected. A display screen 71 may also be arranged in the display means 85. On the screen 71 actual numbers can be displayed, representing e.g. the cooling capacity of the cooling means or the heat generated by the power windings and core.

The information carried by the signal 80, i.e. the operation conditions of the transformer, is preferably at least partly formatted according to a standard that is suitable for a web technology means for communication and/or remote execution. Such a standard, makes it possible to display the information carried by the signal 80 by a web based computer program, such as a web browser. The standards may include, but are not limited to Hyper Text Markup Language (HTML), Extensible HTML (XHTML), Extensible Markup Language (XML), Simple Object Access Protocol (SOAP) and Wireless Device Markup Language (WDML).

The performing means 50 preferably includes formatting means and a transmitter to carry out formatting of the information of the signal 80 according to the preferred standard and transmitting the signal 80 to the display means 85. In a preferred embodiment, the performing means 50 is compatible with wireless standards specifying an "over-the-air" interface between the performing means 50 and the remote and/or portable display means 85. Such standards may include IEEE 802.11, HomeRF, a standard of the Bluetooth Special Internet Group (SIG), or if the signal is transmitted as infrared waves, IrDA and IrCOMM standards.

The output signal from the performance means of the condition diagnosing apparatus may not only be used for indicating the operation conditions of the transformer and any malfunctions thereof. The output signal may also be fed into different systems that control and/or simulate the operation of the transformer. By feeding such systems with e.g. the obtained actual values of the cooling capacity of the cooling devices and the amount of heat generated by the windings, core and other transformer parts, a more accurate control/simulation is obtained compared with if only expected values would be used. For instance, if a system only uses the calculated heat generated by the windings, core and other transformer parts as a possible heat source, i.e. omit external factors, a faulty control/simulation of the transformer operation may result. Under certain extreme conditions such faulty control/simulation may lead to exceeding safety temperature thresholds, since the heat contribution from e.g. the sun is omitted in the control/simulation. Similar applies to the heat flow out from the transformer system. Most control/simulation systems use the maximum (expected) value of the cooling capacity in the control/simulation. However, if any of the cooling devices are damaged or obstructed the actual cooling capacity is lower than this maximum (expected) value, and hence the control/simulation will be incorrect. Therefore, by combining the condition diagnosing of the present invention with different transformer control and/or simulation systems a more accurate and reliable control and simulation, respectively, of the operation of the transformer is obtained. Consequently, the present invention is a good complement to the different control and simulation systems that control/simulate power transformers. The data from the performing means of the present invention may also be used in calculating a forecast of hot-spot temperatures of the windings and loading capability of the transformer. As for the simulation systems above, a more accurate forecast is obtained if e.g. the actual cooling capacity of the cooling devices, determined by the performing means, is used instead of an expected cooling capacity.

It will be understood by those skilled in the art that various modifications and changes may be made to the present invention without departure from the scope thereof, which is defined by the appended claims.

What is claimed is:

1. A method for condition diagnosing of an inductive power device having power windings immersed in a fluid being cooled by cooling means, the method comprising:
   determining an actual heat content ($Q^{actual}$) of said fluid;
   obtaining a previous heat content ($Q^{previous}$) of said fluid;
   calculating an expected heat flow into said fluid ($Q_{heat}^{expected}$);
   calculating an expected heat flow out from said fluid ($Q_{cool}^{expected}$); and
   performing diagnosing actions based on an evaluation of all of said actual heat content ($Q^{actual}$) said previous heat content ($Q^{previous}$), said expected heat flow into said fluid ($Q_{heat}^{expected}$) and said expected heat flow out from said fluid ($Q_{cool}^{expected}$) taken together.

2. The method according to claim 1, wherein
   said expected heat flow into said fluid ($Q_{heat}^{expected}$) is approximated by an expected heat generated by said windings and a core, around which said windings are wound.

3. The method according to claim 1, wherein
   said expected heat flow out from said fluid ($Q_{cool}^{expected}$) is approximated by an expected cooling capacity of said cooling means.

4. The method according to claim 1, further comprising:
   calculating said previous heat content ($Q^{previous}$) intermittently from said expected heat flow into said fluid ($Q_{heat}^{expected}$) and said expected heat flow out from said fluid ($Q_{cool}^{expected}$).

5. The method according to claim 1, further comprising:
   determining a difference between said expected heat flow into said fluid ($Q_{heat}^{expected}$) and said expected heat flow out from said fluid ($Q_{cool}^{expected}$); and
   adding said previous heat content ($Q^{previous}$) to said difference in order to obtain an expected heat content of said fluid;
   whereby said diagnostics actions being based on a comparison between said expected heat content and said actual heat content ($Q^{actual}$).

6. The method according to claim 1, wherein said diagnostics actions comprise indication of error functioning.

7. The method according to claim 1, further comprising:
   storing a representation of aid actual heat content ($Q^{actual}$) in a memory means.

8. The method according to claim 7, wherein said obtaining said previous heat content ($Q^{previous}$) comprises:
   obtaining said previous he content ($Q_{heat}^{expected}$) of said fluid from said memory means.

9. The method according to claim 1, wherein said calculating said expected heat flow into said fluid ($Q_{heat}^{expected}$) comprises:
   obtaining values of winding currents.

10. The method according to claim 9, wherein said expected heat flow into said fluid ($Q_{heat}^{expected}$) is calculated from resistive losses, eddy losses and core losses, obtainable from said windin current value.

11. The method according to claim 1, wherein said calculating said expected heat flow out from said fluid ($Q_{cool}^{expected}$) comprises:
    measuring an ambient temp rature ($T_{amb}$).

12. The method according to claim 11, wherein said expected heat flow out from said fluid ($Q_{cool}^{expected}$) is determined from:

$$Q_{cool}^{expected} \propto K_1(\hat{T} - T_{amb})^\beta,$$

where β is a constant associated wth said cooling means, $K_1$ depends on the viscosity of said fluid and the number of cooling means operating and $\hat{T}$ is an average temperature of said fluid.

13. The method according to claim 1, wherein said step of determining said actual heat content ($Q^{actual}$) is dependent upon direct temperature measurements.

14. The method according to claim 13, wherein said direct temperature measurements are performed for temperatures below an alarm temperature threshold of said inductive power device.

15. The method according to claim 13, wherein said direct temperature measurements at least comprise a top ($T_T$) and a bottom ($T_B$) temperature measurement of said fluid.

16. The method according to claim 15, wherein said actual heat content ($Q^{actual}$) is expressed as:

$$Q^{actual} = Q_T^{actual} + Q_B^{actual},$$

where $Q_T^{actual}$ and $Q_B^{actual}$ is an actual top and bottom heat content of said fluid, respectively, and is determined as:

$$Q_T^{actual} = \alpha m_{fluid} c_{fluid} \hat{T}_T$$

$$Q_B^{actual} = (1 - \alpha) m_{fluid} c_{fluid} \hat{T}_B,$$

where $C_{fluid}$ and $m_{fluid}$ are a specifi heat capacity and a mass of said fluid, respectively, $\hat{T}_T$ and $\hat{T}_B$ is an average top and bottom fluid temperature, respectively, and $\alpha$ and $1 - \alpha$ is a top and bottom fluid fraction of the total fluid in said inductive power device.

17. The method according to claim 15, further comprising:
calculating an expected top and bottom temperature of said fluid from said expected heat flow into said fluid ($Q_{heat}^{expected}$), said expected heat flow out from said fluid ($Q_{cool}^{expected}$) and said previous heat content ($Q^{previous}$);
determining an expected temperature difference between said expected top and bottom fluid temperatures;
determining an actual temperature difference between said top ($T_T$) and bottom ($T_B$) temperature of said fluid; and
comparing said expected temperature difference and said actual temperature difference.

18. The method according to claim 1, further comprising:
determining a sum of said actual heat content ($Q^{actual}$) and said expected heat flow out from said fluid ($Q_{cool}^{expected}$);
subtracting said sum by said previous heat content ($Q^{previous}$) in order to obtain an actual heat flow into said fluid; whereby said diagnostics actions being based on a comparison between said actual heat flow into said fluid and said expected heat flow into said fluid ($Q_{heat}^{expected}$).

19. The method according to claim 18, wherein said performing said diagnostics comprises:
obtaining a ratio between said expected heat flow into said fluid ($Q_{heat}^{expected}$) and said actual heat flow into said fluid.

20. The method according to claim 19, wherein said ratio is obtained by curve fitting of time dependent measurements of said actual heat flow into said fluid and said expected heat flow into said fluid ($Q_{heat}^{expected}$).

21. The method according to claim 19, further comprising repeating said method for different ambient conditions, thereby obtaining a quotient for each ambient condition, said diagnostics measures being based on said quotients.

22. The method according to claim 1, further comprising:
determining a difference between said expected heat flow into said fluid ($Q_{heat}^{expected}$) and said actual heat content ($Q^{actual}$); and
adding said previous heat content ($Q^{previous}$) to said difference in order to obtain an actual heat flow out from said fluid;
whereby said diagnostics actions being based on a comparison between said actual heat flow out said fluid and said expected heat flow out from said fluid ($Q_{cool}^{expected}$).

23. The method according to claim 22, wherein said performing said diagnostics comprises:
obtaining a ratio between said actual heat flow out from said fluid and said expected heat flow out from said fluid ($Q_{cool}^{expected}$).

24. The method according to claim 23, wherein said ratio is obtained by curve fitting of time d pendent measurements of said actual heat flow out said fluid and said expected heat flow out from said fluid ($Q_{cool}^{expected}$).

25. The method according to claim 23, further comprising repeating said method for different cooling conditions, thereby obtaining a ratio for each cooling condition, said diagnostics actions being based on said ratios.

26. The method according to claim 25, wherein a cooling condition is defined by the number of cooling means operating, and/or operating effect of said cooling means.

27. An apparatus for condition diagnosing of an inductive power device having power windings immersed in a fluid being cooled by cooling means, comprising:
means for determining an actual heat content of said fluid;
means for obtaining a previous heat content of said fluid;
means for calculating an expected heat flow into said fluid;
means for calculating an expected heat flow out from said fluid; and
performance means in connection with said calculating, determining and obtaining means, being arranged for performing diagnosing actions based on an evaluation of all of said actual of heat content, said previous heat content, said expected heat flow into and out from said fluid taken together.

28. The apparatus according to claim 27, wherein said determining means is connected to thermometers arranged in connection with said fluid for measurements of a top and a bottom temperature thereof.

29. The apparatus according to claim 27, wherein said means for calculating said expected heat flow into said fluid is connected to means for obtaining values of winding currents.

30. The apparatus according to claim 27, wherein said means for calculating said expected heat flow out from said fluid is connected to thermometers for measuring ambient and fluid temperatures.

31. The apparatus according to claim 27, further comprising indicators in connection with said performance means being arranged for indicating error functioning.

32. The apparatus according to claim 27, wherein said inductive power device is a power transformer.

33. The apparatus according to claim 27, wherein said inductive power device is a reactor.

34. An inductive power device comprising power windings immersed in a fluid being cooled by cooling means, and condition diagnosing means, in turn comprising:
means for determining an actual heat content of said fluid;
means for obtaining a previous heat content of said fluid;
means for calculating an expected heat flow into said fluid;
means for calculating an expected heat flow out from said fluid; and
performance means in connection with said calculating, determining and obtaining means, being arranged for performing diagnosing actions based on an evaluation of all of said actual of heat content, said previous heat content, said expected heat flow into and out from said fluid taken together.

35. The power device according to claim 34, wherein said determining means is connected to thermometers arranged in connection with said fluid for measurements of a top and a bottom temperature thereof.

36. The power device according to claim 34, wherein said means for calculating said expected heat flow into said fluid is connected to means for obtaining values of winding currents.

37. The power device according to claim 34, wherein said means for calculating said expected heat flow out from said fluid is connected to thermometers for measuring ambient and a fluid temperatures.

38. The power device according to claim 34, further comprising indicators in connection with said performance means being arranged for indicating error functioning.

39. The power device according to claim 34, wherein said inductive power device is a power transformer.

40. The power device according to claim 34, wherein said inductive power device is a reactor.

41. A computer program product comprising a computer readable medium and computer code means and/or software code portions recorded on the computer readable medium for making a processor perform the steps of determining an actual heat content ($Q^{actual}$) of said fluid;

obtaining a previous heat content ($Q^{previous}$) of said fluid;

calculating an expected heat flow into said fluid ($Q_{heat}^{expected}$);

calculating an expected heat flow out from said fluid ($Q_{heat}^{expected}$); and performing diagnosing actions based on an evaluation of all of said actual heat content ($Q^{actual}$), said previous heat content ($Q^{previous}$), said expected heat flow into said fluid ($Q_{heat}^{expected}$) and said expected heat flow out from said fluid ($Q_{cool}^{expected}$) taken together.

42. The computer program product according to claim 41, wherein the computer program product is supplied via a network.

43. The computer program product according to claim 42, wherein the network is the internet.

44. A method for generating a data signal comprising information concerning operation conditions of an inductive power device immersed in a fluid, the method comprising evaluating an actual heat content of said fluid, a previous heat content of said fluid, an expected heat flow into said fluid and an expected heat flow from said fluid taken together, and generating the data signal based on information obtained from the evaluation.

45. The method for generating a data signal according to claim 44, wherein said information is at least partly formatted according to a standard suitable for a web technology means for communication and/or remote execution.

46. The method for generating a data signal according to claim 45, wherein said standard is selected from the list of:

Hyper Text Markup Language (HTML);

Extensible HTML (XHTML);

Extensible Markup Language (XML);

Simple Object Access Protocol (SOAP); and

Wireless Device Markup Language (WDML).

47. The method for generating a data signal according to claim 44, wherein said data signal is transmitted by a wireless transmitting means.

48. The method for generating a data signal according to claim 47, wherein said wireless transmitting means is compatible with at least one of the standards in the list of:

IEEE 802.11;

HomeRF; and a standard of the Bluetooth Special Internet Group (SIG).

49. The method for generating a data signal according to claim 47, wherein said data signal is received by a remote display means.

50. The method for generating a data signal according to claim 47, wherein said data signal is received by a portable display means.

51. The method for generating a data signal according to claim 47, wherein said wireless transmitting means transmits said information as infrared waves.

52. The method for generating a data signal according to claim 51, wherein said wireless transmitting means is compatible with an infrared standard, such as IrDA and/or IrGOMM protocols.

* * * * *